United States Patent
Hiramoto et al.

(10) Patent No.: US 7,042,686 B2
(45) Date of Patent: May 9, 2006

(54) MAGNETORESISTIVE ELEMENT AND METHOD FOR PRODUCING THE SAME

(75) Inventors: Masayoshi Hiramoto, Nara (JP); Akihiro Odagawa, Nara (JP); Nozomu Matukawa, Nara (JP); Kenji Iijima, Kyoto (JP); Hiroshi Sakakima, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 139 days.

(21) Appl. No.: 10/871,165

(22) Filed: Jun. 18, 2004

(65) Prior Publication Data

US 2004/0228046 A1 Nov. 18, 2004

Related U.S. Application Data

(62) Division of application No. 10/052,725, filed on Jan. 18, 2002, now Pat. No. 6,771,473.

(30) Foreign Application Priority Data

Jan. 22, 2001 (JP) .............................. 2001-012748

(51) Int. Cl.
*G11B 5/33* (2006.01)
*G11B 5/127* (2006.01)
*H01L 21/00* (2006.01)

(52) U.S. Cl. .............................. 360/324.2; 29/603.08; 29/603.13; 438/3

(58) Field of Classification Search ................ 360/324, 360/324.2; 29/603.08, 603.13; 438/3
See application file for complete search history.

(56) References Cited

U.S. PATENT DOCUMENTS

| 5,390,061 | A | 2/1995 | Nakatani et al. |
| 5,747,859 | A | 5/1998 | Mizushima et al. |
| 5,764,567 | A | 6/1998 | Parkin |
| 5,966,275 | A | 10/1999 | Iijima |
| 5,973,334 | A | 10/1999 | Mizushima et al. |
| 5,986,858 | A | 11/1999 | Sato et al. |
| 6,051,304 | A | 4/2000 | Takahashi |
| 6,069,820 | A | 5/2000 | Inomata et al. |
| 6,110,751 | A | 8/2000 | Sato et al. |
| 6,183,859 | B1 | 2/2001 | Chen et al. |
| 6,232,777 | B1 | 5/2001 | Sato et al. |
| 6,359,289 | B1 | 3/2002 | Parkin |

(Continued)

FOREIGN PATENT DOCUMENTS

JP 4-103013 4/1992

(Continued)

*Primary Examiner*—William J Klimowicz
(74) *Attorney, Agent, or Firm*—Hamre, Schumann, Mueller & Larson, P.C.

(57) ABSTRACT

The present invention provides a magnetoresistive element that includes a pair of magnetic layers and an intermediate layer between the magnetic layers. The intermediate layer contains at least three elements selected from Groups 2 to 17, and the elements include at least one selected from the group consisting of F, O, N, C and B. According to the invention, a magnetoresistive element with high magnetoresistance change ratio and low resistance can be provided. The invention also provides a method for producing a magnetoresistive element. The method includes forming a precursor and forming at least one part of the intermediate layer from the precursor. The precursor is reacted with at least one reactive species selected from the group consisting of oxygen atoms, nitrogen atoms and carbon atoms in a reactive atmosphere containing the reactive species.

10 Claims, 4 Drawing Sheets

U.S. PATENT DOCUMENTS

| | | |
|---|---|---|
| 6,429,497 B1 | 8/2002 | Nickel |
| 6,451,215 B1 | 9/2002 | Shimazawa et al. |
| 6,462,641 B1 | 10/2002 | Dieny et al. |
| 6,583,971 B1 | 6/2003 | Shen et al. |
| 6,632,520 B1 | 10/2003 | Hiramoto et al. |
| 6,771,473 B1 * | 8/2004 | Hiramoto et al. ........ 360/324.2 |
| 2004/0082081 A1 * | 4/2004 | Sharma ........................ 438/3 |
| 2005/0122633 A1 * | 6/2005 | Nowak et al. .............. 360/324 |

FOREIGN PATENT DOCUMENTS

| | | |
|---|---|---|
| JP | 9-78234 | 3/1997 |
| JP | 2000-77744 | 3/2000 |
| JP | 2000-150233 | 5/2000 |
| JP | 2000-150984 | 5/2000 |
| JP | 2000-188435 | 7/2000 |
| JP | 2000-331473 | 11/2000 |
| TW | 332301 | 5/1998 |
| WO | WO 9617970 A2 * | 6/1996 |

* cited by examiner

MAGNETORESISTIVE ELEMENT AND METHOD FOR PRODUCING THE SAME This application is a divisional of application Ser. No. 10/052,725, filed 18 Jan. 2002, now U.S. Pat. No. 6,771,473, entitled MAGNETORESISTIVE ELEMENT AND METHOD FOR PRODUCING THE SAME, which application(s) are incorporated herein by reference.

BACKGROUND OF THE INVENTION

1. Field of the Invention

The present invention relates to a magnetoresistive element and a method for producing the same.

2. Description of the Related Art

Tunnel magnetoresistive (TMR) elements have been the subject of in-depth research for application to magnetic heads, MRAMs and the like since the TMR elements having a magnetic material/tunnel insulating layer (tunnel layer)/a magnetic material as the basic structure were found to achieve high magnetoresistance change ratio (MR ratio).

The TMR elements utilize the fact that the tunneling probability between the magnetic materials is changed with the relative magnetization angle of the two magnetic materials sandwiching the tunnel layer. Aluminum oxide is commonly used as the tunnel layer. In general, aluminum oxide is formed by oxidizing a metal aluminum film formed on a magnetic material. Exceptionally, an example of a TMR element produced with boron nitride (BN) that exhibits a higher MR than that produced with aluminum oxide has been reported (JP4-103013A). However, referring to many other study examples, it is believed that aluminum oxide provides the highest MR at present.

In order to use a TMR element in a magnetic device such as a magnetic head and an MRAM, it is desirable to reduce the element size in order to improve the magnetic recording density and the memory packaging density. The tunnel junction resistance is increased with decreasing element size, so that the smaller junction resistance per unit area is better. One effective method for reducing the junction resistance is to reduce the thickness of the tunnel layer. However, when the thickness of a metal aluminum film increasingly is reduced, aluminum is formed in an island shape, so that the thickness of the tunnel layer becomes increasingly non-uniform, which eventually makes it difficult to form a film.

When the thickness of the tunnel layer is reduced, the MR ratio also is reduced. This seems to occur for the following reason. As the tunnel layer becomes thin, the magnetostatic coupling or tunnel exchange coupling between the magnetic layers via the tunnel layer is increased by a so-called orange-peel effect, so that a preferable relative magnetization angle between the magnetic layers cannot be obtained or leak current is increased.

SUMMARY OF THE INVENTION

Therefore, with the foregoing in mind, the present invention provides an intermediate layer and a novel method for producing the intermediate layer.

A magnetoresistive element of the present invention includes a pair of magnetic layers and an intermediate layer located between the magnetic layers. The intermediate layer contains at least three elements selected from Groups 2 to 17, and the elements include at least one selected from the group consisting of F, O, N, C and B.

Groups 2 to 17 correspond to Groups IIA to VIII and IB to VIIB of the old periodic table defined by the International Union of Pure and Applied Chemistry (IUPAC). Groups 2 to 17 include all the elements other than those of Group 1 and Group 18, for example, elements of atom numbers 57 to 71, which are called lanthanoid.

The present invention also provides a method for producing a magnetoresistive element including a pair of magnetic layers and an intermediate layer located between the magnetic layers. This method includes forming a precursor, and forming at least one part of the intermediate layer from the precursor. The precursor is reacted with at least one reactive species selected from the group consisting of oxygen atoms, nitrogen atoms and carbon atoms in a reactive atmosphere containing the reactive species. The method can include two or more steps of forming a precursor. In this case, a second precursor is formed after a first precursor turns to a part of the intermediate layer.

DESCRIPTION OF THE PREFERRED EMBODIMENTS

Figure 1:
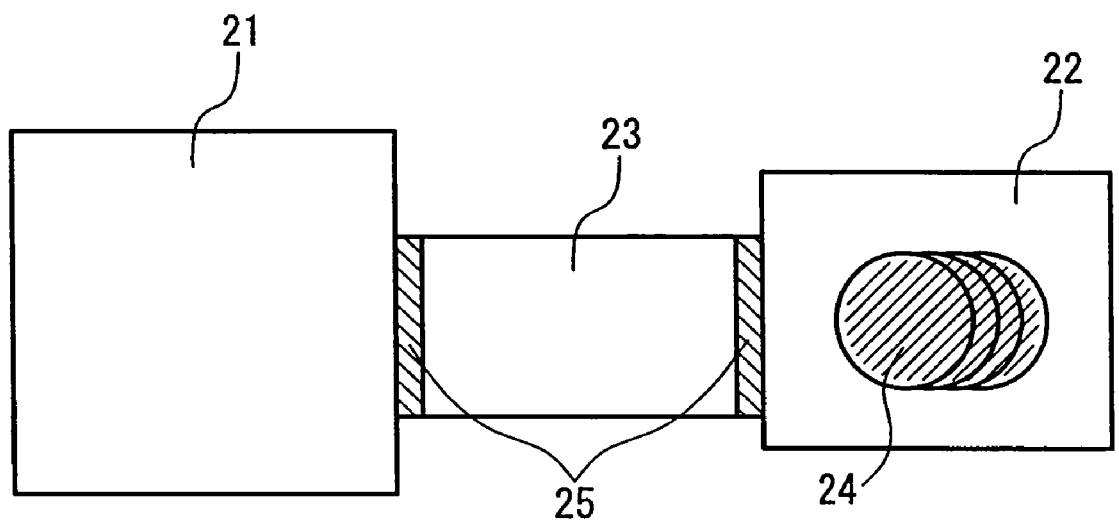
FIG. 1 is a view showing an example of a structure of an apparatus for carrying out a method of the present invention.

Hereinafter, preferable embodiments of the present invention will be described.

At least one element selected from F, O, N, C, and B contained in an intermediate layer has an effect on improvement of the heat resistance of an element. This improvement introduces increasing MR ratio. The element selected from F, O, N, C, and B causes increasing of a barrier height. The barrier height can be reduced to an appropriate height by having the intermediate layer contain at least three elements, including the element selected from F, O, N, C, and B. Therefore, the present invention can provide a high MR ratio with a low junction resistance.

The intermediate layer acts as an insulator or a semiconductor with respect to the thickness direction, and further acts as a tunnel layer or a hot electron conductive layer. The intermediate layer may be used as a layer interacting with spin, for example, by forming a quantum level, or by forming a hybridized orbital with conduction spin in the vicinity of the interface with the magnetic layer or inside the intermediate layer.

The intermediate layer may include a metal element other than Al, and preferably contains Al, in addition to this metal element. In another preferable embodiment, the intermediate layer includes at least two elements selected from Groups 2 to 17 other than F, O, C, N and B.

The intermediate layer may include Al, at least one selected from the group consisting of O and N, and at least one element selected from Groups 2 to 17 other than Al, O and N.

In still another preferable embodiment, the intermediate layer includes B, N, and at least one element selected from Groups 2 to 17 other than B and N.

It is preferable that the intermediate layer includes at least two elements selected from B, Al, Ga and In, and further contains N. This intermediate layer makes it easy to stoichiometrically adjust the amount of nitrogen, which facilitates achievement of a tunnel junction with uniform film quality.

The composition of the intermediate layer may change in a thickness direction. The intermediate layer may be either a single layered film or a multilayered film. The composition varying in the intermediate layer may be introduced by changing a reactive atmosphere in a single film and may be introduced by a multilayered structure that includes films having different compositions. If the intermediate layer has a multilayered structure, it is sufficient that the above-described elements are contained in at least one of the films constituting the intermediate layer.

An intermediate layer with composition changing or a multi-layered intermediate layer can suppress MR ratio from decreasing with an increasing bias current.

In a preferable embodiment of the present invention, the intermediate layer includes a first film and a second film that has a different barrier height than that of the first film. For example, where the intermediate layer includes a first intermediate film that is in contact with either one of a pair of magnetic layers, and a second intermediate film that is in contact with the other of the magnetic layer and a third intermediate film that is located between the first and the second intermediate films, it is preferable that the barrier height of the third intermediate film is lower than at least one of the barrier height of the first intermediate film and the barrier height of the second intermediate film. In other words, a material that has a relatively high barrier potential is preferably arranged on the interface with the magnetic layer while a material that has a relatively low barrier potential is preferably arranged in the inside of the intermediate layer. The number of the films has no limitations as long as that preferable arrangement can be achieved.

The preferable examples of the multilayered intermediate layer include a combination of a first film of at least one selected from AlN, AlON $Al_2O_3$ and BN with a second film that has a barrier height lower than that of the first film. An intermediate layer having a three-layered structure of a high barrier film/a low barrier film/a high barrier film is more preferable. The low barrier film may have some tunnel levels that contribute to increasing the MR ratio.

The intermediate layer may include a magnetic film. In this case, it is preferable that at least one non-magnetic film is present between the magnetic film and each of the pair of magnetic layers sandwiching the intermediate layer. The magnetic film is formed preferably of a material having a high polarizability (for example, a material having a higher polarizability than that of the material for the pair of magnetic layers), and more specifically, a half metal such as XMnSb (in this specification, X is at least one selected from Ni, Cu, Pt), LaSrMnO, $CrO_2$ and $Fe_3O_4$.

The intermediate layer may include a non-magnetic metal film. A preferable film structure of the intermediate layer includes a multilayered film including a non-magnetic metal film and a dielectric.

There is no particular limitation regarding the thickness of the intermediate layer, but a thickness of 0.5 nm or more and 5 nm or less is preferable. When the thickness is less than 0.5 nm, the magnetic coupling between the magnetic layers sandwiching the intermediate layer is so strong that the MR ratio is reduced. When it is more than 5 nm, the tunneling probability is reduced and thus the junction resistance becomes too large.

The intermediate layer may include a single crystal film, a polycrystaliine film or an amorphous film. A single crystal film makes tunnel conductivity more uniform while an amorphous film reduces an interface stress with the magnetic layer.

The magnetic layers can be formed of any conventionally used material without particular limitation, but it is preferable that at least one of the pair of magnetic layers contains at least one selected from F, O, N, C and B. This is because the interface energy between the magnetic layers and the intermediate layer is reduced, which makes it easy to form a stable film even if the film is thin.

A ferromagnetic material may be present between at least one of the pair of magnetic layers and the intermediate layer. This ferromagnetic material may be a ferromagnetic layer having a thickness of 0.5 nm or less. This ferromagnetic layer is formed preferably in the form of a film having a thickness of, for example, 0.1 nm or more, but it is not necessary to be a film and it can be dispersed in the form of fine particles at the interface with the intermediate layer.

Preferable examples of the ferromagnetic material present at the interface with the intermediate layer include (i) a ferromagnetic material including at least one element selected from Fe, Co and Ni, and (ii) a half metal. Preferable examples of the half metal include half metallic ferromagnetic materials such as XMnSb, LaSrMnO, LaSrMnO, $CrO_2$, $Fe_3O_4$ and FeCr.

For the magnetic layer that is in contact with this ferromagnetic material on the surface opposite to the intermediate layer, a ferromagnetic material containing at least 70 atomic % of at least one selected from Fe, Co and Ni is preferable. It is preferable that the Curie temperature of the ferromagnetic material is 200° C. or more. In order to keep the Curie temperature high, it is preferable that the thickness of this magnetic layer is more than 0.5 nm, which improves the temperature stability, especially when the ferromagnetic material interposed therebetween is a half metal.

Next, preferable embodiments of the method of present invention will be described.

In the manufacturing method, the precursor of the intermediate layer may be formed in a reactive atmosphere containing at least one reactive species selected from the group consisting of oxygen atoms, nitrogen atoms and carbon atoms. The precursor can be formed in two or more steps. In this case, the method preferably includes: forming a first precursor in a first reactive atmosphere; forming a first intermediate film as a part of the intermediate layer from the first precursor; forming a second precursor in a second reactive atmosphere; and forming a second intermediate film as a part of the intermediate layer from the second precursor, and the second reactive atmosphere is more reactive, or more vigorous than the first reactive atmosphere.

In another preferable embodiment, the method includes: forming a first precursor; forming a first intermediate film as a part of the intermediate layer from the first precursor in a first reactive atmosphere; forming a second precursor; and forming a second intermediate film as a part of the intermediate layer from the second precursor in a second reactive atmosphere, and the second reactive atmosphere is more reactive than the first reactive atmosphere.

A reactive species acting on a precursor may affect the film (e.g., the magnetic layer) underlying the precursor. Therefore, when intense reaction conditions are applied, the magnetic layer may be deteriorated by oxidation or the like. However, if a film to cover the magnetic layer is first formed under relatively mild conditions, the magnetic layer is hardly deteriorated by the reactive species. If the intermediate layer is formed while changing the reaction conditions, a desired intermediate layer can be obtained efficiently while suppressing the deterioration of the magnetic layer.

The reactivity of the atmosphere, or the ability to promote the reaction with the precursor can be controlled by the temperature, the activation state of the reactive species, the partial pressure of the reactive species or the like. The partial pressure of the reaction species is one of the conditions that easily can be controlled. In a preferable embodiment, the method of the present invention includes a method for increasing the partial pressure of the reactive species in the atmosphere for the second precursor relative to that of the reactive species in the atmosphere for the first precursor.

In the preferable embodiment of the present invention, a "mild" reaction atmosphere is applied before a "severe" reaction atmosphere is applied. It is preferable that the "mild" atmosphere is an atmosphere that can change a precursor into the state having less than 80% of a reaction species such as F, O, N and C with respect to the stoichiometric value. It is preferable that the "severe" atmosphere is an atmosphere that can change a precursor into the state having at least 80%, preferably at least 99% of a reaction species such as F, O, N and C with respect to the stoichiometric value.

The process for forming the intermediate layer may be performed by dividing the process into three or more operations. In this case, the first formation process and the second formation process are not necessarily performed sequentially.

When a process for forming the intermediate layer includes n precursor formation processes, it is preferable that the reactive atmosphere for the $m^{th}$ precursor formation process is adjusted to be more reactive than that for the $(m-1)^{th}$ precursor formation process, where n is an integer of 2 or more, and m is an integer selected from n. In order to achieve a satisfactory junction with the intermediate layer, it may be necessary, for example, to oxidize the precursor over a comparatively long reaction time. If the conditions are gradually intensified, a satisfactory intermediate layer can be formed in a short reaction time.

In the initial film forming process, a reaction with a reactive species may be performed intentionally so that a part of the precursor remains unreacted, and the next precursor is formed on the partially unreacted precursor. Heating may be performed to cause a reaction between the partially unreacted precursor with the elements contained in the magnetic layer underlying the intermediate layer. There is no particular limitation regarding the heating temperature, but a temperature of about 200 to about 400 is preferable. Heating in a heat treatment required for producing an element may be used for this heating.

An element that can be a reactive species present in the magnetic layer (e.g., at least one selected from O, N and C) may deteriorate the characteristics of the magnetic layer. If the element is reacted with an unreacted portion of the precursor and removed, the deterioration of the magnetic layer can be suppressed. The unreacted precursor serves to protect the underlying magnetic layer from oxidation or the like that is performed later. In order to leave a part of the precursor unreacted, the thickness of the precursor can be controlled to be large to the extent that the precursor is not entirely reacted under the applied reaction conditions.

Furthermore, the inventors of the present invention found that especially when the precursor contains an element other than Al, the volume ratio of the precursor and the intermediate layer produced therefrom significantly affects the characteristics of the intermediate layer.

More specifically, a preferable embodiment of the method of the present invention includes a method in which the ratio of the volume Va of a film formed from a precursor with respect to the volume Vb of the precursor is 1.05 or more and 2.0 or less.

The precursor can be formed by vacuum film formation techniques such as sputtering. The precursor formed by this technique generally has a density of about 60 to 99.9% of the theoretical density. In the precursor, which is not densely filled (or has pores), the volume thereof increases or decreases with a reaction with a reactive species. When Va/Vb is less than 1.05, a leakage current may occur between the pair of magnetic layers sandwiching the intermediate layer having a very small thickness. On the other hand, when Va/Vb is more than 2.0, the intermediate layer becomes non-uniform so that the resistance is likely to have a large variation, so that the volume expansion may cause cracks in an extreme case.

It is more preferable that the intermediate layer is formed by reacting an intermediate layer precursor having a density of at least 90% of the theoretical density with a reactive species such that Va/Vb is 1.1 or more and 1.5 or less. This preferable method is advantageous for achieving a low junction resistance and a high MR ratio at the same time.

As described above, in order to achieve a low resistance of the intermediate layer, it is advantageous for the intermediate layer to contain a plurality of elements. Therefore, in each method described above, it is preferable that the precursor includes at least three elements selected from Groups 2 to 17 after the reaction with a reactive species.

There is no particular limitation regarding the reactive species, as long as it reacts with the precursor, but for example, the reactive species can contain at least one selected from oxygen, nitrogen, and carbon atoms, preferably oxygen atoms and/or nitrogen atoms. An atmosphere containing oxygen atoms and nitrogen atoms is particularly preferable. More specifically, an atmosphere containing at least one selected from ozone, oxygen plasma, nitrogen plasma, oxygen radicals, and nitrogen radicals is preferable. In this specification, there is no particular limitation regarding the state of "atoms". The atoms can be present as molecules, plasma, radicals or the like.

The atmosphere used for the reaction of the precursor preferably includes at least one selected from Kr atoms and Xe atoms. These inert gases can make the energy level more uniform for an atmosphere that includes plasma or radicals of at least one of oxygen and nitrogen, or ozone. This preferable atmosphere further may include Ar atoms.

The precursor may be brought in contact with a first atmosphere including at least one selected from Ar atoms and nitrogen atoms, and then may be brought in contact with a second atmosphere including oxygen atoms and at least one selected from Ar atoms and nitrogen atoms. The first atmosphere is preferably at least 100 mTorr and the second atmosphere is preferably from 1 to 100 mTorr. The relatively high pressure in a chamber with the first atmosphere before introducing the second atmosphere can suppress contamination with impurities that often are brought into the chamber with the second atmosphere, thus preventing the intermediate layer from deteriorating.

The precursor can be selected as appropriate, depending on a desired intermediate layer. For example, in order to form $Al_2O_3$ as the intermediate layer, metal aluminum (Al) or aluminum oxide ($AlO_x$ (x<1.5)) can be used.

It is preferable that the precursor includes an amorphous phase. This is because an amorphous precursor can uniformly cover the surface of the magnetic layer. For forming an amorphous phase, a precursor that includes two or more transition metals, or a precursor that includes at least one transition metal and at least one selected from B, C, Si, and P may be used. These combinations of elements can reduce the difference between the melting point and a glass transition temperature, thus preventing rapid crystallization.

A preferable embodiment of the present invention includes: forming a first magnetic layer on each of at least two substrates; forming a precursor on each of the first magnetic layers in a film-forming chamber; transporting the at least two substrates from the film-forming chamber to a reaction chamber; forming at least a part of the intermediate layer from each of the precursors in a reactive atmosphere of the reaction chamber; and forming a second magnetic layer on each of the intermediate layers. The characteristics of the intermediate layer are affected easily by various conditions of the processes for forming the intermediate layer. If the intermediate layers are formed with respect to a plurality of substrates collectively, as described above, non-uniformity in the characteristics of the element from substrate to substrate can be suppressed. This method can be carried out with the apparatus as disclosed in FIGS. 1 and 2, which has a film-forming chamber 21 and 31$a$ or 31$b$, and a reaction chamber (load lock chamber) 22 and 32. In this apparatus, the chambers are connected to each other via a vacuum transport chamber 23 and 33 with gate valves 25 and 35. Substrates 24 and 34 can be transferred between the film-forming chamber and the reaction chamber in a vacuum atmosphere. The reaction chamber that also can be used as a load lock chamber can miniaturize the apparatus. On the other hand, a load lock chamber with a reaction chamber and a film-forming chamber that are connected via vacuum transport chambers can improve the productivity.

Figure 3:
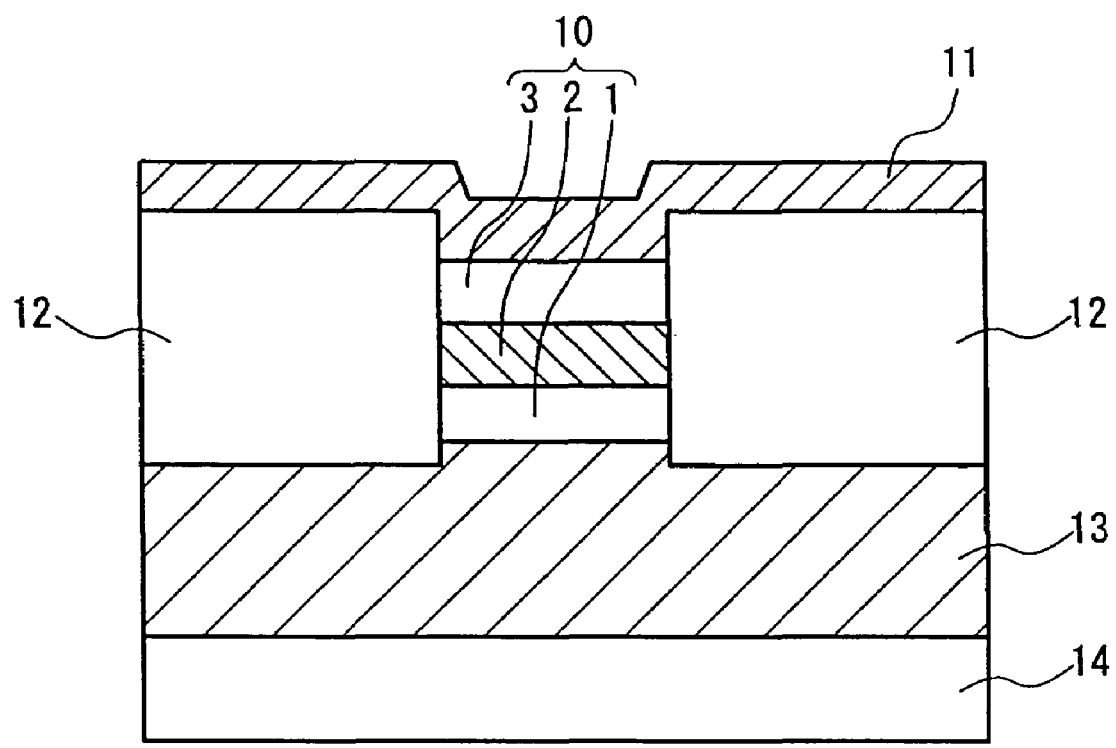
FIG. 3 is a cross-sectional view showing an example of a magnetoresistive element of the present invention.

FIG. 3 is a cross-sectional view of an example of the magnetoresistive element of the present invention. A magnetoresistive element 10 includes a first magnetic layer 1, an intermediate layer 2, and a second magnetic layer 3 as basic films. In this element, the electrical resistance between the magnetic layers 1 and 3 sandwiching the intermediate layer 2 is changed by changing the relative magnetization angle between the magnetic layers 1 and 3 by the external magnetic field. A change in the electrical resistance is detected by current flowing between electrodes 11 and 13. The area other than the element between the two electrodes is insulated by interlayer insulating films 12. A multilayered film including these components can be formed on a substrate 14 by sputtering or the like.

The resistance can be changed by fixing the magnetization of either one of the magnetic layers 1 and 3 and causing magnetization rotation of the other magnetic layer (free magnetic layer). It is preferable to provide a magnetization rotation suppressing layer on the magnetic layer (fixed magnetic layer) whose magnetization is fixed on the surface opposite to the intermediate layer. The magnetization rotation suppressing layer can be formed of a high coercive magnetic material, an antiferromagnetic material, a laminated ferrimagnetic material or the like. A multilayer film of laminated ferrimagnetic material/antiferromagnetic material, laminated ferrimagnetic material/high coercive magnetic material or the like can be used as the magnetization rotation suppressing layer. A laminated ferrimagnetic material can be used as the fixed magnetic layer.

FePt, CoPt, CoPtTa, CoCrPrB and the like are preferable as the high coercive magnetic material. For the laminated ferrimagnetic material, a laminated structure of at least two magnetic layers MT and at least one non-magnetic layer X can be used. The laminated ferrimagnetic material serves to enhance the fixed magnetic field of the fixed layer by the two magnetic layers being coupled antiferromagnetically via the non-magnetic layer. X can be Cu, Ag, or AU, but Ru, Rh, Ir, and Re are preferable, and Ru is particularly preferable. A preferable thickness of Ru is about 0.6 to 0.8 nm. For MT, a ferromagnetic material containing at least 70 atomic % of a magnetic metal that is at least one selected from Fe, Co and Ni is suitable. A preferable thickness of this film is about 0.5 to 5 nm. As the antiferromagnetic material, a single material of Cr as well as an alloy of Mn and/or Cr and at least one element selected from Ru, Re, Ir, Rh, Pt and Pd are preferable. A preferable thickness of the antiferromagnetic material is about 1 to 100 nm. In order to improve the characteristics of the antiferromagnetic material or to prevent thermal diffusion between the antiferromagnetic material and the non-magnetic material (e.g., electrode) that is in contact with the antiferromagnetic material, an underlying layer or a diffusion prevention layer made of Hf, Ta, NiFe, NiFeCr, Cr or the like may be formed in contact with the antiferromagnetic material.

For the magnetic layers 1 and 3, any known materials can be used without any particular limitation. As the magnetic layer, a magnetic material containing at least 50 atomic % of a metal magnetic element that is at least one selected from Fe, Co and Ni in the range of at least 0.1 nm from the vicinity of the interface with the intermediate layer is preferable. The material that satisfies this requirement includes FeCo alloys such as $Fe_{25}Co_{75}$ and $Fe_{50}Co_{50}$, NiFe alloys such as $Ni_{40}Fe_{60}$ and $Ni_{81}Fe_{19}$, NiFeCo alloys, and alloys of an non-magnetic element and a magnetic element such as FeCr, FeSiAl, FeSi, FeAl, FeCoSi, FeCoAl, FeCoSiAl, FeCoTn, Fe(Ni)(Co)Pt, Fe(Ni)(Co)Pd, Fe(Ni)(Co)Rh, Fe(Ni)(Co)Ir, and Fe(Ni)(Co)Ru. As the magnetic material, nitrides of FeN, FeTiN, FeAlN, FeSiN, FeTaN, FeCoN, FeCoTiN, FeCoAlN, FeCoSiN, and FeCoTaN, oxides of $Fe_3O_4$, MnZn ferrite, NiZn ferrite or the like, or amorphous magnetic materials such as CoNbZr and CoTaNbZr can be used. As the magnetic material, half metals (half metallic ferromagnetic material) such as XMnSb, LaSrMnO, LaCaSrMnO, and $CrO_2$ can be used. It is preferable that the half metal is contained in an amount of 50 atomic % or more. A magnetic semiconductor obtained by doping ZnO with an element selected from V, Cr, Fe, Co and Ni can be used.

The magnetic layers 1 and 3 are not necessarily constituted by a uniform composition. For converting to be soft magnetic or hard magnetic, achieving a high spin polarizability in the vicinity of the Fermi surface at the intermediate layer interface, or increasing the spin polarizability by forming an artificial lattice or forming a quantum level, a plurality of magnetic materials having different compositions or crystal structures may be laminated, or a magnetic material and a non-magnetic material may be laminated.

EXAMPLES

In the Examples, materials that were not analyzed are expressed by elements included without numerals.

Example 1

In this example, a multicomponent film-forming apparatus having the structure as shown in FIG. 3 was used, in which a film-forming chamber (ultimate vacuum $5 \times 10^{-9}$ Torr) in which magnetron sputtering can be performed is connected to a load lock chamber via a vacuum transport chamber. In the load lock chamber, reverse sputtering can be performed, nitrogen radicals, oxygen, and oxygen radicals can be introduced, and a substrate can be heated with a lamp. In the film-forming chamber of this apparatus, the following film was formed on a 6 inch silicon substrate provided with a thermal oxide film.

Ta(3)/Cu(750)/Ta(3)/PtMn(30)/Co$_{90}$Fe$_{10}$(3)/Ru(0.7)/ Co$_{90}$Fe$_{10}$(2)/Co$_{50}$Fe$_{50}$(1)/intermediate layer/Co$_{50}$Fe$_{50}$(1)/ NiFe(2)/Ru(0.7)/NiFe(2)/Ta(5)

In the above-described film, the order of each film corresponds to the other from the substrate side, and the figures in parentheses indicate the thickness of the film (the unit is nm; this applies to the following).

This multilayered film is constituted by underlying film/ lower electrode/underlying film/antiferromagnetic material/ laminated ferrimagnetic material/fixed magnetic layer/intermediate layer/free magnetic layer/protective layer. In Co$_{50}$Fe$_{50}$(1)/NiFe(2)/Ru(0.7)/NiFe(2), which corresponds to the free magnetic layer, a soft laminated ferrimagnetic material in which NiFe sandwiching Ru are coupled by exchange coupling simplifies the structure of the magnetic domain of Co$_{50}$Fe$_{50}$.

Next, in order to provide uniaxial anisotropy to the fixed magnetic layer, a heat treatment was performed to the substrate provided with the multilayered film at 260° C. in a vacuum while applying a magnetic field of 5 kOe. This film was processed to have a mesa shape as shown in FIG. 1, and an interlayer insulating film and an upper electrode were formed. The cross-section area of the element of the intermediate layer was 0.5 µm$^2$. Al$_2$O$_3$ having a thickness of 300 nm was used as the interlayer insulating film. A laminate of 5 nm Ta and 750 nm Cu was used as the upper electrode.

A method for producing the intermediate layer will be described below. First, an intermediate layer precursor was produced by discharging targets of elements constituting each compound (see Table 1) other than oxygen and nitrogen in an Ar gas. The thickness of the precursor was 0.3 to 0.4 nm. When the elements other than oxygen and nitrogen include carbon, a carbide target was used. When there are a plurality of elements other than oxygen, nitrogen and carbon, a target for each element was prepared, and a plurality of targets were discharged at the same time.

Then, the substrate was transported from the film-forming chamber to the load lock chamber, where the precursor was oxidized and/or nitrided. Oxidation was performed by introducing oxygen at 10 to 600 Torr, and causing a reaction for about 10 seconds to 6 hours. Nitridation was performed by introducing nitrogen radicals for 3 to 900 seconds. Oxynitridation was performed by performing oxidation and nitridation in this order in the same manner as above. It was confirmed that oxynitridation or nitridation can be performed by reverse sputtering RF discharge in an atmosphere containing a nitrogen gas, instead of introducing nitrogen radicals.

Subsequently, the same intermediate layer precursor as above was formed to have a thickness of 0.2 to 0.3 nm, and oxidation, nitridation or oxynitridation was repeated in the load lock chamber.

The resistance change ratio between the upper and lower electrodes that changes with the external magnetic field in the thus produced magnetoresistive element was measured by allowing current to flow between the upper and lower electrodes. In addition, a junction resistance (RA) per unit area (1 µm$^2$) of the intermediate layer was measured. Table 1 shows the results together with the composition of the intermediate layer.

In Table 1, for convenience, the stoichiometric composition is shown, but the intermediate layers formed herein do not necessarily have the stoichiometric composition. For example, strictly speaking, Al$_2$O$_3$ can be shown as AlOx (x=about 1.1 to 1.5). Thus, the indicated composition of the intermediate layer includes compositions deviating by about 20 to 30% from the stoichiometric composition. For the intermediate layer comprising a plurality of compounds, the ratio of the compounds was adjusted so as to achieve a target ratio of 1:1, but the actual ratio was not confirmed, so that it might have been deviated from the target ratio. The effect of the compound (MgO in the case of Al$_2$O$_3$.MgO) that was added to the intermediate layer was confirmed in a wide range from 5 to 95 wt %.

Regarding the Al$_2$O$_3$ layers, samples with the intermediate layer precursors whose thicknesses are gradually decreased further than above in order to reduce the RA were produced and the same measurement was performed. In Table 1, the sample indicated by * was an intermediate layer obtained in the same operation as for the samples made of other materials.

TABLE 1

| Intermediate layer | MR (%) | RA (Ωµm$^2$) |
|---|---|---|
| Al$_2$O$_3$ | 3 | 1 |
| Al$_2$O$_3$ | 8 | 5 |
| Al$_2$O$_3$ | 15 | 10 |
| Al$_2$O$_3$ | 21 | 15 |
| Al$_2$O$_3$ | 28 | 20 |
| * Al$_2$O$_3$ | 38 | 30 |
| Al$_2$O$_3$.MgO | 31 | 15 |
| Al$_2$O$_3$.SrTiO$_3$ | 35 | 18 |
| Al$_2$O$_3$.Y$_2$O$_3$ | 37 | 14 |
| Al$_2$O$_3$.CeO$_2$ | 33 | 13 |
| Al$_2$O$_3$.TiO$_2$ | 36 | 12 |
| Al$_2$O$_3$.ZrO$_2$ | 35 | 14 |
| Al$_2$O$_3$.HfO$_2$ | 37 | 18 |
| Al$_2$O$_3$.V$_2$O$_5$ | 33 | 16 |
| Al$_2$O$_3$.Nb$_2$O$_5$ | 34 | 17 |
| Al$_2$O$_3$.Ta$_2$O$_5$ | 38 | 18 |
| Al$_2$O$_3$.Cr$_2$O$_3$ | 35 | 16 |
| Al$_2$O$_3$.MnO | 30 | 12 |
| Al$_2$O$_3$.Cu$_2$O | 37 | 10 |
| Al$_2$O$_3$.ZnO | 30 | 14 |
| Al$_2$O$_3$.Ga$_2$O$_3$ | 33 | 16 |
| Al$_2$O$_3$.SiO$_2$ | 34 | 12 |
| Al$_2$O$_3$.AlF$_3$ | 31 | 15 |
| Al$_2$O$_3$.Al$_4$C$_3$ | 28 | 10 |
| Al$_2$O$_3$.AlN | 26 | 10 |
| AlN | 24 | 18 |
| AlN.HfN | 25 | 8 |
| AlN.ZrN | 24 | 7 |
| AlN.TiN | 23 | 6 |
| AlN.TaN | 25 | 5 |
| AlN.NbN | 26 | 6 |
| AlN.VN | 24 | 7 |
| AlN.BN | 31 | 5 |
| AlN.GaN | 28 | 3 |
| AlN.InN | 26 | 3 |
| AlN.Al$_4$C$_3$ | 20 | 3 |
| BN | 18 | 12 |
| BN.HfN | 22 | 2 |
| BN.ZrN | 19 | 1 |
| BN.TiN | 18 | 3 |
| BN.TaN | 19 | 2 |
| BN.NbN | 18 | 2 |
| BN.VN | 16 | 1 |
| BN.GaN | 20 | 1 |
| BN.InN | 19 | 1 |

Table 1 shows that when the RA is reduced by decreasing the thickness of the Al$_2$O$_3$ film, the MR ratio also is reduced. On the other hand, in the intermediate layers comprising other elements, in addition to Al$_2$O$_3$, when the MR ratios were about the same, the RA was lower than that of Al$_2$O$_3$ without other elements. Also in the intermediate layers comprising other elements, in addition to AlN or BN, a relatively lower RA was obtained with about the same MR ratio. In particular, when the intermediate layer was formed of a nitride of at least one selected from Al, B, Ga, and In, a low RA was achieved while ensuring a sufficient MA value.

Also when intermediate layers whose compositions are varied in the thickness direction were produced, a high MR and a low RA were obtained at the same time. The composition variation can be performed, for example, by forming a multilayered film including a film including either one of the two compounds shown in Table 1, adjusting the voltages applied to a plurality of targets, or adjusting oxygen, nitrogen or the like that is used as the reactive species. Even if a plurality of elements are not contained uniformly in the intermediate layer, the effect of adding an element can be obtained.

Regarding the relationship between the thickness of the intermediate layer and the RA, it was confirmed that the RA increases exponentially with respect to the thickness of the intermediate layer. Based on this relationship, the resistance of the intermediate layer can be adjusted in accordance with a desired device.

Example 2

Figure 2:
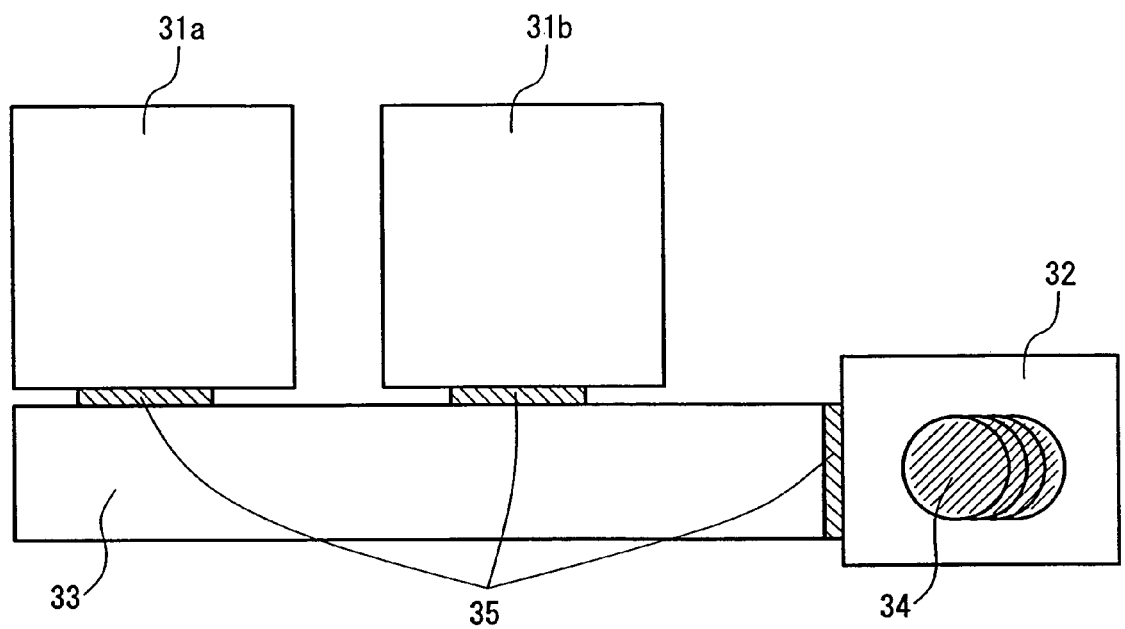
FIG. 2 is a view showing another example of a structure of an apparatus for carrying out a method of the present invention.

A multicomponent film-forming apparatus having the structure as shown in FIG. 2 was used, in which a film-forming chamber for magnetron sputtering (ultimate vacuum $5 \times 10^{-9}$ Torr), a film-forming chamber for IBD (ion beam deposition; ultimate vacuum $5 \times 10^{-9}$ Torr) and a load lock chamber are connected to each other via a vacuum transport chamber. Using this apparatus, the following film was formed on a 6 inch silicon substrate provided with a thermal oxide film.

Ta(3)/Cu(500)/Ta(3)/MnRh(30)/$Co_{90}Fe_{10}$(3)/Ru(0.7)/ $Co_{90}Fe_{10}$(2)/$Co_{75}Fe_{25}$(1)/intermediate layer/$Co_{75}Fe_{25}$(1)/ NiFe(5)/Ta(5)

The precursor for the intermediate layer was formed by IBD, and the layers other than that were formed by magnetron sputtering. This multilayered film is constituted by underlying film/lower electrode/underlying film/antiferromagnetic material/laminated ferrimagnetic material/fixed magnetic layer/intermediate layer/free magnetic layer/protective layer.

Next, in order to provide uniaxial anisotropy to the fixed magnetic layer, a heat treatment was performed at 250° C. in a vacuum while applying a magnetic field of 5 kOe. This film was processed to have a mesa shape as shown in FIG. 3 such that the element area is 0.5 µm$^2$. Cu(500) was used as the upper electrode.

In this example, $Al_2O_3$ having a thickness of 1.5 nm and a non-magnetic element film having a thickness of 0.25 nm were formed in this order as the intermediate layer. In addition, an intermediate layer of a multilayered film in which a pair of non-magnetic element films each having a thickness of 0.25 nm sandwiches an $Al_2O_3$ film having a thickness of 1.5 nm also was produced.

Table 2 shows the film structure of this multilayered film. The MR ratio of the produced element was measured using −0.5 V and 0.5 V as the bias.

TABLE 2

| Intermediate layer | MR (%) | MR decrease ratio (%) |
|---|---|---|
| $Al_2O_3$ | 15/15 | 50 |
| $Al_2O_3$/Cu | −3/3 | −20 |

TABLE 2-continued

| Intermediate layer | MR (%) | MR decrease ratio (%) |
|---|---|---|
| $Al_2O_3$/Ag | −0.1/0.5 | −30 |
| $Al_2O_3$/Au | −2/2 | −10 |
| $Al_2O_3$/Ru | −2/2 | −15 |
| Ru/$Al_2O_3$/Ru | −3/5 | −20 |
| $Al_2O_3$/Rh | −1/2 | −5 |
| $Al_2O_3$/Ir | −1/2 | −10 |
| $Al_2O_3$/Re | −2/3 | −10 |
| $Al_2O_3$/Pt | 12/18 | 30 |
| $Al_2O_3$/Pd | 15/18 | 40 |
| $Al_2O_3$/Ti | 11/21 | 20 |
| $Al_2O_3$/Zr | 11/16 | 30 |
| $Al_2O_3$/Hf | 12/17 | 40 |
| $Al_2O_3$/V | 11/18 | 30 |
| $Al_2O_3$/Nb | 13/19 | 20 |
| $Al_2O_3$/Ta | 15/20 | 30 |
| $Al_2O_3$/Cr | 13/23 | 20 |
| $Al_2O_3$/Mo | 11/15 | 10 |
| $Al_2O_3$/W | 13/15 | 20 |

The MR ratios in Table 2 are those obtained when positive and negative biases are applied, and the relatively smaller value is shown on the left side. Furthermore, the MR decrease ratio is a decrease ratio of the MR ratio (the relatively larger MR ratio under application of bias) to the value at zero bias. A negative decrease ratio indicates an increase of the MR ratio due to bias application.

As shown in Table 2, when Cu, Ag, Au, Ru, Rh, Ir, and Re were laminated, negative MR ratios were obtained. The element indicating a negative MR ratio can be used as an element for determining whether the bias is positive or negative by being combined with a comparator for comparing the standard resistance. When a non-magnetic film was laminated, the decrease ratio at application of bias was reduced, and the MR ratio increased in some cases. A large asymmetric profile is useful for a device that requires a high output to increase the S/N in the MR changes.

The phenomenon as described above also can be seen when AlN or BN is used instead of $Al_2O_3$. Regarding the asymmetric profile, when the thickness of the non-magnetic layer is in the range from 0.1 to 1 nm, the bias dependence differs depending on the thickness, but when the thickness exceeds 1 nm, the MR is hardly detected.

Example 3

Using the multicomponent film-forming apparatus used in Example 2, the following film was formed on a 6 inch silicon substrate provided with a thermal oxide film.

Ta(3)/Cu(500)/Ta(3)/PtMn(30)/Co(3)/Ru(0.7)/Co(2)/ $Co_{50}Fe_{50}$(1)/intermediate layer/$Co_{74}Fe_{26}$(1)/NiFe(5)/Ta (5)

The precursor for the intermediate layer and $Co_{74}Fe_{26}$ was formed by IBD, and the layers other than that were formed by magnetron sputtering. This multilayered film is constituted of underlying film/lower electrode/underlying film/ antiferromagnetic material/laminated ferrimagnetic material/fixed magnetic layer/intermediate layer/free magnetic layer/protective layer. Then, a heat treatment, mesa processing and formation of an upper electrode were performed in the same manner as in Example 2.

The film structures shown in Table 3 were used for the intermediate layer. Each of the $Al_2O_3$ films on both ends of a three layer film was produced by forming an Al film having a thickness of 0.3 nm, oxidizing the Al film at 20° C. in an oxygen atmosphere at 20 Torr for one minute and then in an oxygen atmosphere at 200 Torr for one minute, further forming an Al film having a thickness of 0.2 nm, and oxidizing the Al film in an oxygen atmosphere at 200 Torr for three minutes. A single $Al_2O_3$ film was produced by repeating the above-described processes such that the total thickness of the Al films before oxidation was 1 nm.

The AlN films on both ends of a three layer film were formed by forming an Al film having a thickness of 0.5 nm, and then performing reverse sputtering in an atmosphere of $Ar+N_2$ for 10 seconds.

The AlN film and the BN film in the center of a three layer film were formed to a thickness of 0.2 nm, using an AlN target and a BN target, respectively, while using nitrogen plasma as an assist gas. Similarly, other compound films disposed in the center were formed to a thickness of 0.2 nm with targets of the corresponding compounds.

The MR ratios of the thus produced elements were measured. Table 3 shows the results together with the structure of the intermediate layer. In Table 3, regarding Heusler alloys (NiMnSb, CuMnSb, and PtMnSb), the composition deviation due to sputtering is large, so that only components are shown. In the films with the composition ratio, the same effect can be obtained even if the composition ratio deviates from the stoichiometric ratio by about 10%.

TABLE 3

| Intermediate layer | MR (%) |
| --- | --- |
| $Al_2O_3$ | 40 |
| $Al_2O_3/Fe_3O_4/Al_2O_3$ | 49 |
| $Al_2O_3/NiMnSb/Al_2O_3$ | 52 |
| $Al_2O_3/CuMnSb/Al_2O_3$ | 53 |
| $Al_2O_3/PtMnSb/Al_2O_3$ | 55 |
| $Al_2O_3/LaSrMnO/Al_2O_3$ | 51 |
| $Al_2O_3/CrO_2/Al_2O_3$ | 55 |
| $Al_2O_3/AlN/Al_2O_3$ | 46 |
| $Al_2O_3/BN/Al_2O_3$ | 45 |
| AlN/BN/AlN | 45 |

As shown in Table 3, higher MR ratios were obtained from the elements using a three layer intermediate layer than those using an intermediate layer of a single $Al_2O_3$ layer film.

When the thickness of the central layer was varied in the range from 0.1 to 1.2 nm while restricting the total thickness of the intermediate layer having a three layered structure to 0.1 to 2 nm, even higher MR ratios were obtained.

Furthermore, when the thickness of the central layer was 0.2 nm and the thickness of the $Al_2O_3$ films and AlN films on both ends were varied, then high MR ratios were obtained in the range of the thickness of the entire intermediate layer from 0.5 nm to 5 nm.

Next, the stability of the intermediate layer was examined while changing the total thickness of the intermediate layer with the thickness ratio of the layers constituting the intermediate layer unchanged.

In this example, an element having a film structure of Ta(3)/Cu(500)/Cr(2.2)/Co(3)/Ru(0.7)/Co(2)/Fe(1)/intermediate layer/Fe(1)/NiFe(5)/Ta(5) and elements in which the Fe layer in this film structure is replaced by FeN, FeHfC, FeTaC, FeTaN, FeHfN, FeZrN, FeNbB, FeAlO, FeSiO or FeAlF were produced. When measurement was performed under application of a magnetic field of 600 Oe, it was indicated that the produced elements exhibit a spin valve type MR curve without using an antiferromagnetic material. However, as the intermediate layer become thin, in the elements using Fe as the magnetic layer, the MR was not detected. On the other hand, it was confirmed that when the magnetic material including at least one selected from F, O, C and N was used as the intermediate layer, MR ratios were detected, as long as the thickness of the intermediate layer is not less than about 0.5 nm.

Example 4

Using the multicomponent film-forming apparatus used in Example 2, the following film was formed on a 6 inch silicon substrate provided with a thermal oxide film.

Ta(3)/Cu(500)/Ta(3)/PtPdMn(30)/Co(3)/Ru(0.7)/Co(2)/
  $Fe_{24}Co_{76}$(1)/AlON/free magnetic layer/Ta (5)

A first magnetic film in the free magnetic layer was formed by IBD, and the layers other than that were formed by magnetron sputtering. This multilayered film is constituted of underlying film/lower electrode/underlying film/antiferromagnetic material/laminated ferrimagnetic material/fixed magnetic layer/intermediate layer/free magnetic layer/protective layer.

In this example, the AlON intermediate layer was formed by forming an Al film, and then introducing mixed radicals of oxygen and nitrogen. The free magnetic layer has a two layer structure of a first magnetic film and a second magnetic film formed in this order from the intermediate layer, and the magnetic layer shown in Table 4 was used as the first magnetic layer, and the $Fe_{50}Cu_{50}$ having a thickness of 5 nm was used as the second magnetic film.

Then, in order to provide uniaxial anisotropy to the fixed magnetic layer, a heat treatment was performed at 250° C. in a vacuum while applying a magnetic field of 5 kOe. This film was processed to have a mesa shape such that the area of the element of the intermediate layer was 0.5 μm². Cu(500) was formed as the upper electrode, and the MR ratios were measured. Table 4 shows the results.

TABLE 4

| First magnetic film (thickness; unit nm) | MR (%) |
| --- | --- |
| None | 40 |
| $Fe_3O_4$ (0.1) | 43 |
| $Fe_3O_4$ (0.25) | 48 |
| $Fe_3O_4$ (0.5) | 46 |
| $Fe_3O_4$ (1) | 40 |
| NiMnSb (0.1) | 45 |
| NiMnSb (0.25) | 47 |
| NiMnSb (0.5) | 45 |
| NiMnSb (1.0) | 40 |
| CuMnSb (0.25) | 46 |
| PtMnSb (0.25) | 45 |
| LaSrMnO (0.25) | 45 |
| $CrO_2$ (0.25) | 48 |
| FeCr (0.25) | 49 |
| $Co_{75}Fe_{25}$ (0.25) | 49 |
| $Co_{80}Fe_{20}$ (0.25) | 49 |

Table 4 confirmed that when a ferromagnetic material having a thickness of 0.1 to 0.5 nm is present between the magnetic layer and the intermediate layer, the MR ratio is increased.

Example 5

In this example, a multicomponent film-forming apparatus (see the simplified drawing of FIG. 1) was used, in which a magnetron sputtering film-forming chamber (ultimate vacuum $5\times10^{-9}$ Torr) and a chamber for reaction and load lock (ultimate vacuum $8\times10^{-8}$ Torr) were connected to each other via a vacuum transport chamber (ultimate vacuum 1×10⁻⁸ Torr) and a gate valve. Twelve silicone substrates with a diameter of 6 inches (S1 to S12) provided with thermal oxide films were mounted in the chamber for reaction and load lock.

First, the substrate S1 was transported to a film-forming chamber, where the following multilayered film was formed, and then the substrate was returned to the load lock chamber.

Ta(3)/Cu(500)/Ta(3)/PtMn(30)/Co$_{90}$Fe$_{10}$(3)/Ru(0.7)/
    Co$_{90}$Fe$_{10}$(3)/Al(0.4)

This film is constituted of underlying film/lower electrode layer/underlying film/antiferromagnetic material/fixed magnetic layer (laminated ferrimagnetic material)/intermediate layer precursor.

Similarly, with respect to the substrates S2 to S12, the multilayered film was formed sequentially on these substrates, and the substrates were transported to the load lock chamber again.

Then, evacuation of the load lock chamber was stopped, and a reaction was caused at an $O_2$ gas partial pressure of 150 Torr for one minute for simultaneous oxidation of the intermediate layer precursors on the 12 substrates. Thereafter, the load lock was evacuated again, and the 12 substrates were transported to the film-forming chamber, where a 0.3 nm Al film, which was to be an intermediate layer precursor, was formed on each substrate. Furthermore, the 12 substrates were transported to the load lock chamber again, where the precursors were oxidized simultaneously under the same conditions as above.

Subsequently, the 12 substrates were transported to the film-forming chamber, and further a film of Co$_{90}$Fe$_{10}$(1)/NiFe(3)/Ta(15) was formed on the intermediate layer (Al$_2$O$_3$). Co$_{90}$Fe$_{10}$(1)/NiFe(3) is a free magnetic layer.

In order to provide uniaxial anisotropy to the fixed magnetic layer, a heat treatment was performed at 280° C. in a vacuum while applying a magnetic field of 5 kOe. This film was subjected to mesa processing such that the cross-section area of the element was 2 μm². Cu(500)/Ta(5) was formed as the upper electrode.

When the MR ratios of the thus produced substrates S1 to S12 were measured, for all the substrates, RA=30 Ωm², and the MR ratio was about 33%. The deviation in the MR ratios between the substrates was within 5%.

When oxidation was simultaneously performed as above, the time required by oxidation was significantly reduced. As a result, the time for forming the entire multilayered film was reduced to about ⅓ of that of individual oxidation.

Furthermore, elements were produced under various oxygen partial pressures in the load lock chamber, reaction times, and substrate heating temperatures by radiant heat, and several sets of oxidation conditions that could provide a MR ratio of about 30% or more were obtained. In the same sample, the oxidation conditions of two operations for the precursor formed by the two operations were the same.

An Al film having a thickness of 0.3 nm was formed directly on the substrate, and the Al film was oxidized under the obtained oxidation conditions. This process was repeated to obtain an aluminum oxide (AlO$_x$) film having a thickness of 50 nm. When this film was analyzed by a RBS method, it was confirmed that values of X that can provide a MR ratio of 30% or more was in the range from 1.2 to 1.5.

The same experiments were performed with respect to aluminum nitride (AlNx) under varied partial pressures of nitrogen radicals, reaction times, and conditions for substrate heating. As a result, X that could provide a MR ratio of 30% or more was found to be 0.8 to 1.

Example 6

In this example, a multicomponent film-forming apparatus having the same structure as in FIG. 2 was used, in which a first film-forming chamber for reactive magnetron sputtering (ultimate vacuum 5×10⁻⁹ Torr), a second film-forming chamber for magnetron sputtering (ultimate vacuum 5×10⁻⁹ Torr) and a chamber for reaction and load lock (ultimate vacuum 8×10⁻⁸ Torr) were connected to each other via a vacuum transport chamber (ultimate vacuum 1×10⁻⁸ Torr) and a gate valve. Twelve silicone substrates each having a diameter of 6 inches (S1 to S12) provided with thermal oxide films were mounted in the chamber for reaction and load lock of this apparatus.

The substrate S1 was transported from the transport chamber to the second film-forming chamber, where the multilayered film having the following structure was formed.

Ta(3)/Cu(500)/Ta(3)/PtPdMn(30)/Co$_{90}$Fe$_{10}$(3)/Ru(0.7)/
    Co$_{90}$Fe$_{10}$(3)

This film has the film structure of underlying film/lower electrode layer/underlying film/antiferromagnetic material/fixed magnetic layer.

Then, the substrate S1 was transported to the first film-forming chamber, where an Al—O film having a thickness of 0.3 nm was formed as a first intermediate layer precursor in an atmosphere of Ar gas and oxygen gas by reactive sputtering. Thereafter, the substrate was transported again to the load lock chamber.

Similarly, multilayered films were formed on the substrates S2 to S12, and then the substrates were repeatedly transported to the load lock chamber.

When the 12 substrates provided with the films were transported to the load lock chamber, evacuation of the load lock chamber was stopped, and the 12 substrates were simultaneously subjected to oxidation at 60 Torr for one minute. The load lock chamber was evacuated again, and then the 12 oxidized substrates were transported sequentially to the first film-forming chamber, where a 0.2 nm Al—O film was formed as a second intermediate layer precursor at the same oxygen partial pressure as for the first intermediate layer precursor. After the precursor was formed on each substrate, the intermediate layer precursors were oxidized simultaneously under the same conditions as above in the load lock chamber again.

Furthermore, a film of Co$_{90}$Fe$_{10}$(1)/NiFe(3)/Ta(15) was formed on the thus produced intermediate layer. In order to provide uniaxial anisotropy to the fixed magnetic layer, a heat treatment was performed at 260° C. in a vacuum while applying a magnetic field of 5 kOe. This film was subjected to mesa processing such that the cross-section area of the element was 5 μm². Cu(500)/Ta(5) was formed as the upper electrode.

The MR ratios (%) and the standardized resistance RA (Ωμm²) when the oxygen flow rate $O_2/(Ar+O_2)$ during the Al—O film formation under the above-described conditions was changed in the range from 0% to 2% were measured. Table 5 shows the results.

When the MR ratios of the produced substrates S1 to S12 were measured, the deviation between the substrates that were produced under the same conditions was found to be within 5%.

TABLE 5

| Oxygen flow rate (%) | RA (Ωμm²) | MR (%) |
| --- | --- | --- |
| 0 | 8 | 5 |
| 0.05 | 8 | 14 |
| 0.1 | 8 | 16 |
| 0.5 | 9 | 15 |
| 1.0 | 10 | 14 |
| 2.0 | 11 | 5 |

*The oxygen flow rate is common to the first precursor and the second precursor.

Table 5 confirmed that in the samples in which the intermediate layer precursors were produced under oxygen flow at a rate of 0.05 to 1% during the Al film formation, a low RA and a high MR can be obtained at the same time. However, the RA became large with increasing oxygen flow, and the MR was reduced at a flow rate of 2% or more. The Al—O film formed directly on the substrate such that the thickness was 100 nm while changing the oxygen flow rate was examined by XRD. Then, it was confirmed that as the oxygen flow rate was increased, the crystal grains were finer, and when the flow rate was 0.5% or more, an amorphous phase was contained.

When the resistance ratio of the Al—O film was obtained by a four-terminal method and a bridge method, the film was found to be conductive, even at a flow rate of 2%, which provided the highest resistance. This indicates that the Al—O film was not a perfect stoichiometric oxide. An Al—O film was formed on a carbon substrate at an oxygen flow rate of 2% and measured by RBS. Then, x in the AlOx was about 1.18.

The effect of reducing the size of crystal grains was confirmed not only when oxygen was used, but also when nitrogen, ammonia gas, and the like were used.

Next, in the above method, elements were produced at an oxygen flow rate of 2% during formation of the second intermediate layer precursor and at an oxygen flow rate of 0 to 1% during formation of the first intermediate layer precursor. Table 6 shows the MR ratios and RA of the measured elements.

TABLE 6

| Oxygen flow rate (%) | RA (Ωμm²) | MR |
| --- | --- | --- |
| 0 | 9 | 12 |
| 0.05 | 9 | 16 |
| 0.1 | 9 | 18 |
| 0.5 | 9 | 17 |
| 1.0 | 10 | 16 |

*The oxygen flow rate is for the first precursor, and the oxygen flow rate for the second precursor is 2%.

Table 6 confirmed that when the first intermediate layer precursor was formed in a less reactive atmosphere than that for the second intermediate layer precursor, the MR was improved. The same results were obtained when nitrides such as Al—N or carbides such as Si—C were produced.

Example 7

A multilayered film having the following structure was formed on a 6 inch silicon substrate provided with a thermal oxide film.

Ta(3)/Cu(500)/Ta(3)/PtMn(30)/Co$_{90}$e$_{10}$(3)/Ru(0.7)/Co$_{90}$Fe$_{10}$(3)

Then, an Al film having a thickness of 0.3 nm was formed as a first intermediate layer precursor and retained in an atmosphere with an oxygen partial pressure of 0.2 Torr for 3 minutes, and then retained in an atmosphere with an oxygen partial pressure of 60 Torr for 30 seconds. Then, an Al film having a thickness of 0.3 nm was formed as a second intermediate layer precursor and retained in an atmosphere with an oxygen partial pressure of 0.2 Torr for 3 minutes, and then retained in an atmosphere with an oxygen partial pressure of 60 Torr for 30 seconds. Oxidation of the precursors was performed by introducing a mixed gas of Ar and oxygen to the load lock chamber as in the above-described examples.

Subsequently, Co$_{90}$Fe$_{10}$(1)/NiFe(5)/Ta(15) was formed on the multilayered film, and a heat treatment was performed at 280° C. in a magnetic field. Furthermore, the film was subjected to mesa processing with a stepper such that the junction area was 0.2 to 4 μm², and an upper electrode was laminated thereon to produce a MR element. Thus, an element, sample a, was obtained.

For comparison, an element (sample b) in which both the first and second intermediate layer precursors were oxidized at an oxygen partial pressure of 0.2 Torr for 3 minutes, and an element (sample c) in which both the first and second intermediate layer precursors were oxidized at an oxygen partial pressure of 60 Torr for 30 seconds were produced.

When the MR ratios and RA of each sample were measured, for sample a, the MR ratio was 10%, and RA was 7 Ωμm². On the other hand, there was no change in MR in sample b, and RA was 0.1 Ωμm² or less. For sample c, the MR ratio was only about 5%.

As in the same manner as for sample a, the intermediate layers were produced by oxidizing Al films having various thickness first in an atmosphere with a relatively low oxygen partial pressure and then in an atmosphere with a relatively high oxygen partial pressure.

Figure 4:
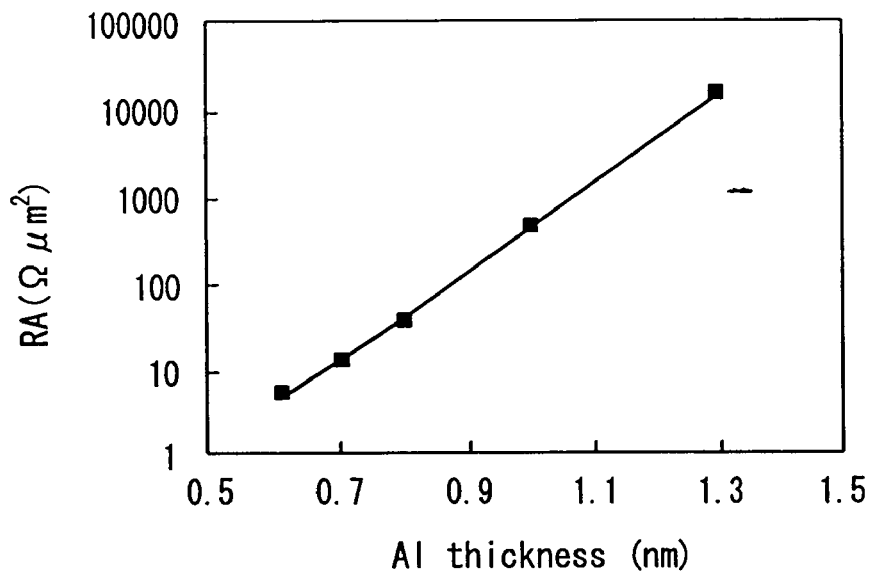
FIG. 4 is a view showing an example of a change in normalized resistance (RA) with respect to the thickness of an Al film.
Figure 5:
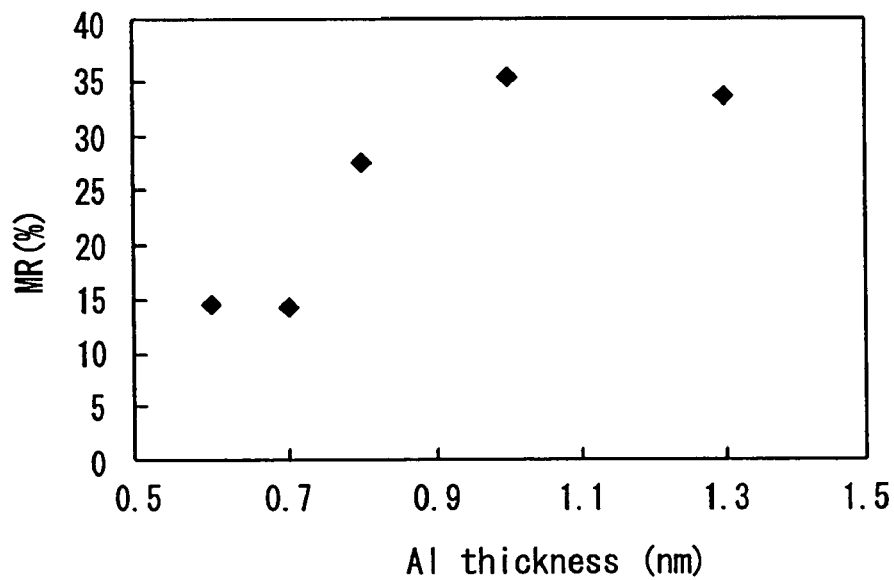
FIG. 5 is a view showing an example of a change in the MR ratio with respect to the thickness of an Al film.

FIG. 4 shows RA with respect to the total thickness of Al, and FIG. 5 shows MR with respect to the total thickness of Al. FIG. 4 indicates that RA increases exponentially with respect to the total thickness of Al. This indicates that the produced AlO$_x$ intermediate layer acts as a tunnel resistance, and that the film quality is uniform regardless of the thickness of the intermediate layer until RA is close to several Ω to several MΩ. Referring to FIG. 5 as well as FIG. 4, it is confirmed that high MR can be obtained in a wide range of RA.

Also when a plurality of elements was formed in one silicon substrate, the above-described method provided a deviation of the MR ratios in the substrate of not more than 5%. For comparison, the same measurement was performed with respect to an element having an intermediate layer that was formed by plasma oxidation of an Al film having a thickness of 1 nm. Then, the deviation of the MR ratio was about 10%.

With respect to the intermediate layers of nitrides or carbides, elements having a high MR ratio from a low junction resistance to a high junction resistance with a small deviation can be produced by forming the intermediate layer precursor first in a less reactive atmosphere and then a more reactive atmosphere.

Example 8

A multilayered film having the following structure was formed on a silicon substrate provided with a thermal oxide film.

Ta(3)/Cu(500)/Ta(2)/NiFeCr(3)/PtMn(30)/Co$_{75}$Fe$_{25}$(3)/Ru(0.7)/Co$_{75}$Fe$_{25}$(3)

Furthermore, an Al film was formed as an intermediate layer precursor, and then a process of nitriding the precursor with radical nitrogen was repeated three times to form AlNx as an intermediate layer. The thickness of the precursor and the extent of nitridation were changed as shown in Table 7. In Table 7, for example, "(0.3, 1.0)" means that a precursor (Al) having a thickness of 0.3 nm is nitrided under the conditions that can achieve 1.0 as x of $AlN_x$. "x" in predetermined conditions was estimated with the average of the composition of $AlN_x$ obtained in the following manner. An Al film having a predetermined thickness was formed on a carbon substrate and nitrided under the predetermined conditions. This operation was repeated to produce $AlN_x$ having a thickness of 100 nm, and the composition of the $AlN_x$ was obtained by Rutherford Backscattering Spectroscopy (RBS).

Furthermore, a film of $Co_{75}Fe_{25}(1)/NiFe(3)/Ta(5)$ was formed on the intermediate layer, and a heat treatment was performed at 280° C. in a magnetic field, then mesa processing was performed and an upper electrode was provided so that a MR element was produced. MR and RA of each MR element were measured. Table 7 shows the results.

TABLE 7

| Intermediate layer production condition (First/Second/Third) | MR (%) | RA |
|---|---|---|
| (0.3, 0.7)/(0.3, 0.7)/(0.3, 0.7) | 5 | 40 |
| (0.3, 1.0)/(0.3, 1.0)/(0.3, 1.0) | 22 | 430 |
| (0.3, 1.0)/(0.3, 0.7)/(0.3, 0.5) | 6 | 130 |
| (0.3, 0.5)/(0.3, 0.7)/(0.3, 1.0) | 47 | 300 |
| (0.3, 0.7)/(0.3, 0.9)/(0.3, 1.0) | 49 | 320 |

Table 7 indicates that when the intermediate layer is produced in n operations (n is an integer of 2 or more) and the reaction conditions are intensified with increasing n, then a high MR can be obtained. It is preferable that the reaction conditions for the intermediate layer precursor of the $n^{th}$ production are stronger than those for the intermediate layer precursor of the $(n-1)^{th}$ production.

This setting manner of the reaction conditions has the same effect on oxides such as $AlO_x$, $SiO_x$, and $TaO_x$, carbides such as SiC, and for example, a reaction converting graphite to diamond, as that on nitrides.

Example 9

A multicomponent film-forming apparatus was used, in which a film-forming chamber (ultimate vacuum $5 \times 10^{-9}$ Torr) where magnetron sputtering could be performed was connected to a reaction chamber via a vacuum transport chamber. In the reaction chamber, reverse sputtering can be performed, nitrogen radicals, oxygen and oxygen radicals can be introduced, and a substrate can be heated by lamp heating. Using this apparatus, a multilayered film having the following structure was formed on a 3 inch silicon substrate provided with a thermal oxide film.

Ta(3)/Cu(750)/Ta(3)/NiFeCr(4)/PtMn(30)/$Co_{90}Fe_{10}$(3)/Ru (0.9)/$Co_{90}Fe_{10}$(3)/intermediate layer/$Ni_{60}Fe_{40}$(4)/Ru (0.9)/NiFe(4)/Ta(5)

Then, in order to provide uniaxial anisotropy to the fixed magnetic layer ($Co_{90}Fe_{10}$(3)/Ru(0.9)/$Co_{90}Fe_{10}$(3)), a magnetic field of 5 kOe was applied at 350° C. in a vacuum. This multilayered film was processed to have a mesa shape with a resist pattern such that the area of the element in the intermediate layer was 0.5 $\mu m^2$, and an interlayer insulating film and an upper electrode were formed. Alumina having a thickness of 300 nm was used as the interlayer insulating film, and for the upper electrode, Cu(750) was formed on Ta that had been subjected to ion milling.

The intermediate layer was produced with the compounds shown in Table 8 in the following manner. First, an intermediate layer precursor was formed to have a thickness of 0.3 to 0.4 nm with a target including components other than oxygen and nitrogen in an Ar gas atmosphere. Then, when forming the intermediate layer as an oxide, the precursor was transported to the load lock chamber, to which oxygen was introduced at 10 to 600 Torr, and a reaction was caused for 10 seconds to 6 hours to oxidize the precursor. When forming the intermediate layer as an oxynitride, oxidation was performed in the same manner as above, and then nitrogen radicals were introduced for 3 to 900 seconds to the load lock chamber.

Furthermore the same intermediate layer precursor as above was formed to have a thickness of 0.2 to 0.3 nm, and was oxidized (oxynitrided) in the load lock chamber in the same manner as above.

The MR of each of the thus produced elements was measured, and the volume change ratio of the intermediate layer precursor due to oxidation (oxynitridation) also was measured. Herein, the volume change ratio was the ratio of the thickness of the intermediate layer after the reaction to the thickness of the unreacted intermediate layer. The ratio of the thickness was measured with a transmission electron microscope (TEM).

Table 8 shows the volume change ratio and the MR.

TABLE 8

| Intermediate layer | change ratio (%) | MR (%) |
|---|---|---|
| MgO | 0.8 | 10 |
| CaO | 0.6 | 1 |
| FeO | 2.1 | 0 |
| $WO_3$ | 3.5 | 0 |
| $Cr_2O_3$ | 2.1 | 1 |
| $MgO.Cr_2O_3$ | 1.05 | 25 |
| $Al_2O_3.Cu_2O$ | 1.4 | 27 |
| $Al_2O_3.MgO$ | 1.1 | 32 |
| $Al_2O_3.FeO$ | 1.5 | 37 |
| $Al_2O_3.Cr_2O_3$ | 2.0 | 21 |
| $Al_2O_3.AlN$ | 1.2 | 35 |

Table 8 shows that when the MR is high when the volume change ratio is in the range from 1.05 to 2.0, in particular, in the range from 1.1 to 1.5. When the leakage current of each element was evaluated, oxynitrided $Al_2O_3.AlN$ was found to have the lowest leakage current characteristics.

Example 10

Using an apparatus for forming a multicomponent film by magnetron sputtering, a multilayered film having the following structure was formed on a 6 inch silicon substrate provided with a thermal oxide film.

Ta(3)/Cu(750)/Ta(3)/$Ni_{60}Fe_{40}$(4)/intermediate layer/$Co_{76}Fe_{24}$(3)/Ru(0.9)/$Co_{76}Fe_{24}$(1)/$N_{80}iFe_{20}$(3)/PtMn(30)/Ta(5)

Then, in order to provide uniaxial anisotropy to the fixed magnetic layer ($Co_{76}Fe_{24}$(3)/Ru(0.9)/$Co_{76}Fe_{24}$(1)), a magnetic field of 5 kOe was applied at 350° C. in a vacuum.

$N_{80}iFe_{20}$(3) was formed to increase the crystal orientation to the (111) plane of PtMn that was formed thereon. When the crystal orientation of PtMn is increased, the unidirectional anisotropy Hua is improved, so that diffusion of Mn during a heat treatment can be suppressed.

Then, the multilayered film was processed to have a mesa shape with a resist pattern such that the area of the element in the intermediate layer was 1 μm², and an interlayer insulating film and an upper electrode were formed. Alumina having a thickness of 300 nm was used as the interlayer insulating film, and for the upper electrode, Cu(750) was formed on Ta that had been subjected to ion milling.

As the intermediate layer, an Al oxide or an Al oxynitride was produced by using P1 to P3 shown in Table 9 in this order.

P1 refers to conditions for an oxidation or nitridation treatment of the surface of $Ni_{60}Fe_{40}$, which is an underlying magnetic layer. P2 refers to oxidation conditions of an Al film (thickness of 0.4 nm) formed in a vacuum, and P3 refers to oxidation conditions of an Al film (thickness of 0.3 nm) formed in a vacuum.

In P1 to P3 in Table 9, the type and the pressure of gas are shown in this order. For example, $O_2$/10T corresponds to a reaction atmosphere of oxygen gas at 10 Torr. The retention time in an atmosphere was one minute. Table 9 shows the MA and RA of the produced elements.

TABLE 9

| Sample | P1 | P2 | P3 | RA | MR |
|---|---|---|---|---|---|
| S1 | None | $O_2$/10T | $O_2$/10T | 30 | 25 |
| S2 | $N_2$/10T | $O_2$/10T | $O_2$/10T | 30 | 38 |
| S3 | $O_2$/10T | $O_2$/10T | $O_2$/10T | 45 | 40 |
| S4 | None | $O_2$/10T | $O_2$/100T | 35 | 26 |
| S5 | $N_2$/10T | $O_2$/10T | $O_2$/1T | 30 | 41 |
| S6 | $O_2$/10T | $O_2$/10T | $O_2$/1T | 45 | 42 |

Table 9 indicates that when P1 for nitriding or oxidizing $Ni_{60}Fe_{40}$, which is the underlying layer, is performed, a high MR can be obtained. However, when oxidation or nitridation conditions are too strong, the magnetization of the underlying magnetic layer deteriorates, so that the MR decreases.

Example 11

A multicomponent film-forming apparatus was used, in which a film-forming chamber (ultimate vacuum $5\times10^{-9}$ Torr) where magnetron sputtering could be performed was connected to a reaction chamber via a vacuum transport chamber. In the reaction chamber, reverse sputtering can be performed, nitrogen radicals, oxygen and oxygen radicals can be introduced, and a substrate can be heated by lamp heating. Using this apparatus, a multilayered film having the following structure was formed on a 3 inch silicon substrate provided with a thermal oxide film.

Ta(3)/Cu(750)/Ta(3)/NiFeCr(4)/PtMn(30)/$Co_{91}Zr_5Ta_4$(3)/ Ru(0.9)/CoZrTa(1.5)/$Co_{75}Fe_{25}$(1)/intermediate layer/ $Ni_{60}Fe_{40}$(4)/Ru(0.9)/NiFe(3)/Ru(0.9)/NiFe(2)/Ta(5)

In this multilayered film, the NiFe/Ru/NiFe/Ru/NiFe layer is a laminated ferrimagnetic material type free magnetic layer. When the laminated ferrimagnetic material is used, the heat stability of the free magnetic layer is increased. NiFeCr increases the crystallinity of PtM so that the diffusion of Mn between layers can be suppressed and the heat resistance of the element can be improved. $Co_{91}Zr_5Ta_4$ is amorphous, so that it has the same effect.

In order to provide uniaxial anisotropy to the fixed magnetic layer of the multilayered film, a magnetic field of 5 kOe was applied at 350° C. in a vacuum. Then, the multilayered film was processed to have a mesa shape with a resist pattern such that the area of the element in the intermediate layer was 0.01 μm², and an interlayer insulating film and an upper electrode were formed. Alumina having a thickness of 300 nm was used as the interlayer insulating film, and for the upper electrode, Cu(750) was formed on Ta that had been subjected to ion milling.

The intermediate layer was produced by reacting an Al film having a thickness of 0.7 nm with radicals of a mixed gas shown in Table 10. The reaction time was optimized so as to achieve the largest MR ratio under each mixed gas condition.

TABLE 10

| Gas species | RA | MR |
|---|---|---|
| Ar + $O_2$ | 120 | 28 |
| Kr + $O_2$ | 110 | 42 |
| Xe + $O_2$ | 110 | 40 |
| Ar + Kr + $O_2$ | 110 | 37 |
| Ar + Xe + $O_2$ | 110 | 36 |
| Ar + $N_2$ | 100 | 32 |
| Ar + Kr + $N_2$ | 100 | 37 |
| Ar + Xe + $N_2$ | 100 | 35 |
| Ar + Kr + $N_2$ + $O_2$ | 110 | 43 |
| Ar + Xe + $N_2$ + $O_2$ | 110 | 41 |
| Kr + $N_2$ + $O_2$ | 110 | 45 |
| Xe + $N_2$ + $O_2$ | 110 | 43 |

Table 10 indicates that when the precursor was reacted with oxygen and/or nitrogen in an atmosphere containing Kr or Xe, the MR was high. An atmosphere containing oxygen and nitrogen, in particular, oxygen, nitrogen and Kr was the most suitable.

Example 12

A multicomponent film-forming apparatus was used, in which a film-forming chamber (ultimate vacuum $5\times10^{-9}$ Torr) where magnetron sputtering could be performed was connected to a reaction chamber via a vacuum transport chamber. In the reaction chamber, reverse sputtering can be performed, nitrogen radicals, oxygen and oxygen radicals can be introduced, and a substrate can be heated by lamp heating. Using this apparatus, a multilayered film having the following structure was formed on a 3 inch silicon substrate provided with a thermal oxide film.

Ta(3)/Cu(750)/Ta(3)/NiFeCr(4)/PtMn(30)/$Co_{75}Fe_{25}$(3)/first intermediate layer/Fe(4)/second intermediate layer/Cu (10)/Ta(5)

The first intermediate layer is a tunnel insulating layer, and the second intermediate layer is an insulating layer conducting hot electrons. Then, the multilayered film was processed to have a mesa shape with a resist pattern such that the area of the element in the intermediate layer was 1 μm², and an interlayer insulating film and an upper electrode were formed. Alumina having a thickness of 300 nm was used as the interlayer insulating film, and for the upper electrode, Cu(750) was formed on Ta that had been subjected to ion milling.

In sample A, the first intermediate layer was formed by oxidizing each of the Al films having a thickness of 0.3 nm, 0.2 nm, or 0.2 nm that were formed in three operations, respectively. The second intermediate layer 2 was formed by oxidizing each of the Al films having a total thickness of 1 nm that were formed in four operations.

In sample B, the film formed in the same manner as for sample A was used as the first intermediate layer. The second intermediate layer was formed by forming Al films having a total thickness of 1 nm that were formed in four operations and oxidizing each of AlMg alloys.

The MR was examined from changes in the potential between the magnetic layers sandwiching the first intermediate layer when an external magnetic field is applied, and then it was found that sample B exhibited a higher MR. Without wishing to be bound to any particular reason for this, it is believed that the third element (Mg) of the second intermediate layer contributes thereto.

Example 13

Using an apparatus for forming a multicomponent film by magnetron sputtering, a multilayered film having the following structure was formed on a 6 inch silicon substrate provided with a thermal oxide film.
Ta(3)/Cu(750)/Ta(3)/NiFeCr(4)/PtMn(30)/Co$_{75}$Fe$_{25}$(4)/first intermediate layer/Ni$_{60}$Fe$_{40}$(4)/Ru(0.9)/Ni$_{60}$Fe$_{40}$(4)/Ru (0.9)/Ni$_{60}$Fe$_{40}$(4)/second intermediate layer/CO$_{75}$Fe$_{25}$ (4)/PtMn(30)/Ta(5)

In order to provide uniaxial anisotropy to the fixed magnetic layer of the multilayered film, a magnetic field of 5 kOe was applied at 280° C. in a vacuum. In this element, a pair of fixed magnetic layers (Co$_{75}$Fe$_{25}$) is arranged such that they sandwich the free magnetic layer (NiFe/Ru/NiFe/Ru/NiFe). Both the first and second intermediate layers are tunnel insulating layers. This multilayered film was processed to have a mesa shape with a resist pattern such that the area of each of the elements in the two intermediate layers was 0.5 µm$^2$, and an interlayer insulating film and an upper electrode were formed. Alumina having a thickness of 300 nm was used as the interlayer insulating film, and for the upper electrode, Cu(750) was formed on Ta that had been subjected to ion milling.

As the first and second intermediate layers, Al oxides or Al oxynitrides were produced by using P1 to P3 shown in Table 11.

P1 shows the type and the pressure of the gas that was introduced to Al having a thickness of 0.4 nm formed on the surface of Co$_{75}$Fe$_{25}$, after the chamber was evacuated to a vacuum. P2 shows the type and the pressure of the gas when oxygen was introduced at 100 Torr subsequently to the process of P1. P3 shows the oxidation conditions of an Al film having a thickness of 0.3 nm subsequently formed after the chamber was evacuated to a vacuum.

In P1 to P3 in Table 11, the type and the pressure of the gas are shown in this order. For example, O$_2$/100T corresponds to a reaction atmosphere of oxygen gas at 100 Torr. P2 shows the total pressure of the gas introduced in P1 and P2. The retention time in the atmosphere was one minute for all the cases of P1 to P3. Table 11 shows MR and RA of the produced films.

TABLE 11

| Sample | P1 | P2 | P3 | RA | MR |
|---|---|---|---|---|---|
| S1 | None | O$_2$/100T | O$_2$/100T | 60 | 32 |
| S2 | N$_2$/100T | O$_2$ + N2/200T | O$_2$/100T | 30 | 39 |
| S3 | Ar/100T | O$_2$ + Ar/200T | O$_2$/100T | 45 | 38 |
| S4 | Ar + N$_2$/100T | O$_2$ + N$_2$ + Ar/10T | O$_2$/100T | 35 | 38 |

Table 11 indicates that excellent MR characteristics can be obtained in samples S2 to S4 obtained by retaining the formed Al film in an atmosphere containing at least one selected from Ar and N$_2$.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for producing a magnetoresistive element including a pair of magnetic layers and an intermediate layer between the magnetic layers, the method comprising:
   forming a first magnetic layer on each of at least two substrates;
   forming a precursor on each of the first magnetic layers in a film-forming chamber;
   transporting the at least two substrates from the film-forming chamber to a reaction chamber; and
   forming at least one part of the intermediate layer from each of the precursor,
   wherein the precursors are reacted with at least one reactive species selected from the group consisting of oxygen atoms, nitrogen atoms and carbon atoms in a reactive atmosphere containing the reactive species in the reaction chamber.

2. The method according to claim 1,
   wherein the precursor is formed in a reactive atmosphere containing at least one reactive species selected from the group consisting of oxygen atoms, nitrogen atoms and carbon atoms.

3. The method according to claim 1, comprising:
   forming a first precursor in a first reactive atmosphere;
   forming a first intermediate film as a part of the intermediate layer from the first precursor;
   forming a second precursor in a second reactive atmosphere; and
   forming a second intermediate film as a part of the intermediate layer from the second precursor,
   wherein the second reactive atmosphere is more reactive than the first reactive atmosphere.

4. The method according to claim 1, comprising:
   forming a first precursor;
   forming a first intermediate film as a part of the intermediate layer from the first precursor in a first reactive atmosphere;
   forming a second precursor; and
   forming a second intermediate film as a part of the intermediate layer from the second precursor in a second reactive atmosphere,
   wherein the second reactive atmosphere is more reactive than the first reactive atmosphere.

5. The method according to claim 1, wherein a ratio of a volume Va of a film from the precursor with respect to a volume Vb of the precursor is not less than 1.05 and not more than 2.0.

6. The method according to claim 5, wherein the precursor includes a metal element other than Al.

7. The method according to claim 1, wherein the reactive atmosphere contains at least oxygen atoms and nitrogen atoms.

8. The method according to claim 1, wherein the reactive atmosphere contains at least one selected from the group consisting of Kr atoms and Xe atoms.

9. The method according to claim 1, wherein the precursor is brought in contact with a first atmosphere containing at least one selected from the group consisting of Ar atoms and nitrogen atoms, and then is brought in contact with a second atmosphere containing oxygen atoms and at least one selected from the group consisting of Ar atoms and nitrogen atoms.

10. The method according to claim 1, wherein the intermediate layer precursor contains an amorphous phase.

* * * * *